US008741734B2

(12) United States Patent
Kim (10) Patent No.: US 8,741,734 B2
(45) Date of Patent: Jun. 3, 2014

(54) SEMICONDUCTOR DEVICE AND METHOD OF FABRICATING THE SAME

(75) Inventor: Seung Bum Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 777 days.

(21) Appl. No.: 12/649,605

(22) Filed: Dec. 30, 2009

(65) Prior Publication Data

US 2011/0079871 A1    Apr. 7, 2011

(30) Foreign Application Priority Data

Oct. 5, 2009    (KR) .................. 10-2009-0094327

(51) Int. Cl.
*H01L 21/76*    (2006.01)

(52) U.S. Cl.
USPC ........... 438/405; 438/404; 438/424; 257/510; 257/E21.546; 257/E29.02

(58) Field of Classification Search
USPC .............. 257/374, 510, E21.546, E29.02; 438/404, 405, 424, 427, 435
See application file for complete search history.

(56) References Cited

U.S. PATENT DOCUMENTS

| 5,480,832 | A * | 1/1996 | Miura et al. ................. 438/404 |
| 5,874,760 | A * | 2/1999 | Burns et al. ................. 257/315 |
| 6,184,151 | B1 * | 2/2001 | Adair et al. ................. 438/743 |
| 6,204,145 | B1 * | 3/2001 | Noble ......................... 438/412 |
| 6,211,039 | B1 * | 4/2001 | Noble ......................... 438/412 |
| 6,790,745 | B1 * | 9/2004 | Blanchard .................. 438/422 |
| 7,033,907 | B2 * | 4/2006 | Kim ............................ 438/425 |
| 7,087,951 | B2 * | 8/2006 | Harari et al. ................ 257/315 |
| 7,115,525 | B2 * | 10/2006 | Abatchev et al. .......... 438/725 |
| 7,732,279 | B2 * | 6/2010 | Park ........................... 438/262 |
| 8,207,028 | B2 * | 6/2012 | Dalton et al. .............. 438/197 |
| 2002/0110973 | A1 * | 8/2002 | Liou et al. ................. 438/211 |
| 2003/0183872 | A1 | 10/2003 | Miida |
| 2003/0197202 | A1 * | 10/2003 | Hashimoto et al. ........ 257/200 |
| 2005/0118784 | A1 | 6/2005 | Kim |
| 2006/0255426 | A1 * | 11/2006 | Inoue et al. ................. 257/510 |

(Continued)

FOREIGN PATENT DOCUMENTS

| CN | 101044596 A | 9/2007 |
| JP | 2004-006658 A | 1/2004 |

(Continued)

OTHER PUBLICATIONS

Japanese Office Action dated Feb. 12, 2014; Appln. No. 2010-004681.

(Continued)

*Primary Examiner* — Colleen Matthews
*Assistant Examiner* — Colleen E Snow
(74) *Attorney, Agent, or Firm* — Ladas & Parry LLP (57) ABSTRACT

A semiconductor device includes a semiconductor substrate having a trench defining an active region. A wall oxide is formed on side walls of the active region extending in the longitudinal direction, and an element isolation layer is formed in the trenches. A method of manufacturing a semiconductor device includes forming line-shape first trenches on a semiconductor substrate so as to define an active region; forming a wall oxide on surfaces of the first trenches; forming a second trench which separates the active region into a plurality of active regions; and filling the trenches with an element isolation layer.

18 Claims, 11 Drawing Sheets

(56) References Cited

U.S. PATENT DOCUMENTS

2008/0191288 A1* 8/2008 Kwon et al. .............. 257/383
2008/0280408 A1 11/2008 Park
2009/0032963 A1 2/2009 Tran
2010/0112496 A1 5/2010 Nakajima et al.
2010/0148248 A1 6/2010 Mikasa
2011/0285029 A1* 11/2011 Tran .............................. 257/774

FOREIGN PATENT DOCUMENTS

| JP | 2006-156731 A | 6/2006 |
| JP | 2009-016814 A | 1/2009 |
| JP | 2010-141107 A | 6/2010 |
| KR | 1020000031193 A | 6/2000 |
| KR | 20010056239 A | 7/2001 |
| WO | 2008/149989 A1 | 12/2008 |
| WO | 2009/020773 A2 | 2/2009 |

OTHER PUBLICATIONS

First Chinese Office Action dated Feb. 8, 2014; Appln. No. 201010002293.9.

* cited by examiner

SEMICONDUCTOR DEVICE AND METHOD OF FABRICATING THE SAME

CROSS-REFERENCES TO RELATED APPLICATIONS

The present application claims priority to Korean patent application number 10-2009-94327, filed on 5 Oct. 2009, which is incorporated by reference in its entirety.

BACKGROUND OF THE INVENTION

An embodiment of the present invention relates generally to a semiconductor device and a method of fabricating the same, and more particularly, to a semiconductor device having a wall oxide on a semiconductor substrate and a method of fabricating the same.

A typical semiconductor memory device includes a cell region having a plurality of memory cells. When increasing the capacity of a semiconductor memory device, i.e., incrementing memory size, additional patterns are required. However, the demand for miniaturization requires that the size of the cell region be reduced or at least limited. Accordingly, the cell region must be highly integrated to secure the desired memory size, thus requiring more patterns to be formed within the limited available space of the cell region. Thus, the critical dimension (e.g., line width) of such a pattern is miniaturized so as to reduce the space it occupies. In order to form a pattern having a minute critical dimension, the lithography process for forming such patterns must be augmented.

In a typical lithography process, a photoresist is first coated on the upper side of a substrate. An exposure process is performed on the photoresist using an exposure mask to define a micro-pattern by making use of a light source having a wavelength length of 365 nm, 248 nm, 193 nm, 153 nm or the like. Thereafter, a photoresist pattern, which defines a micro-pattern, is formed by using a development process. The resolution of such a lithographic process is determined according to the wavelength ($\lambda$) of the light source and the numerical aperture (NA). Generally, resolution is a measure of the ability to separate closely spaced features, and the resolution limit (R) in a lithography process is given by the following equation: $R = k1 \times \lambda / NA$.

In the above equation, K1 is a process constant (also known as the process factor). In order to improve the resolution limit (R), the wavelength should be shorter, the NA should be higher, and the K1 constant should be smaller. The K1 constant has a physical limit, and it is nearly impossible to effectively reduce the value by normal methods. Therefore, it is difficult to improve resolution by reducing the process constant K1. In order to use a shorter wavelength, it would be necessary to develop a photoresist material having a high reactivity to a short wavelength along with an exposure apparatus for applying the short wavelength; thereby making it difficult to form a micro-pattern having a reduced critical dimension by using a shorter wavelength.

Double patterning technology (DPT) is a lithography technique in which minute patterns can be formed using tools already available. In DPT, a pattern is separated into two masks in order to achieve high resolution. Another technology is the spacer patterning technology (SPT), which is similar to the double patterning process, but does not require double exposure or double patterning.

BRIEF SUMMARY OF THE INVENTION

Embodiments of the present invention include a semiconductor device and a method of fabricating the same, in which the size of an active region thereof can be secured, the resistance of a storage node contact can be reduced, and a critical dimension thereof can be reduced.

In an embodiment of the present invention, a method of manufacturing a semiconductor device includes: forming a first trench of line-shape on a semiconductor substrate; forming a wall oxide on a surface of the first trench; filling the first trench in which the wall oxide is formed with an oxide layer so as to form an active region of line-shape; forming a second trench which separates the active region of line-shape with a uniform gap; and filling the second trench with an oxide layer.

The method of manufacturing a semiconductor device according to an embodiment of the present invention may further include forming a liner nitride layer and a liner oxide layer on the surface of the trench in which the wall oxide is formed, after forming a wall oxide on a surface of the first trench. The filling of an oxide layer in the first trench may include: depositing the oxide layer on the semiconductor substrate including the first trench; and performing CMP with the semiconductor substrate as an etch stop layer and removing an oxide layer of an upper portion of the first trench.

The oxide layer may include one or more among a Spin On Dielectric (SOD) oxide layer, a High Density Plasma (HDP) oxide layer or a High Aspect Ratio Process (HARP) oxide layer. Filling the oxide layer in the second trench may include: depositing an oxide layer on the semiconductor substrate including the second trench; and performing CMP with the semiconductor substrate as an etch stop layer and removing an oxide layer of an upper portion of the second trench.

The forming of the first trench may include: forming a hard mask layer on the semiconductor substrate; forming a spacer on an upper portion of the hard mask layer; and etching the hard mask and the semiconductor substrate with the spacer as a mask.

The forming of the hard mask layer may includes forming a first amorphous carbon layer, a first silicon oxynitride layer, a polysilicon layer, a second amorphous carbon layer, and a second silicon oxynitride layer on the semiconductor substrate. Forming the spacer may include: forming a partition on an upper portion of the hard mask layer; performing an etch back process after depositing an oxide layer on the whole surface including the partition and forming a spacer on the side of the partition; and removing the partition.

After forming the spacer, a method of manufacturing a semiconductor device according to an embodiment of the present invention may further include forming a pattern on a peripheral region in the semiconductor substrate.

Forming of the first trench may include: forming a first amorphous carbon layer, a first silicon oxynitride layer, a polysilicon layer, a second amorphous carbon layer, and a second silicon oxynitride layer on the semiconductor substrate; forming a photoresist pattern on an upper portion of the second oxynitride layer; etching the second silicon oxynitride layer and the second amorphous carbon layer with the photoresist pattern as a mask, and forming a partition by removing the photoresist pattern and the second silicon oxynitride layer; performing an etch back process after depositing an oxide layer on an upper portion of the partition and the polysilicon layer and forming a spacer on the side of the partition; removing the partition; and etching the first silicon oxynitride layer, the first amorphous carbon layer, and the semiconductor substrate with the spacer as a mask, and removing the spacer, the first silicon oxynitride layer, and the first amorphous carbon layer.

After forming the second trench, a method of manufacturing a semiconductor device according to an embodiment of the present invention may further include forming a gate intersecting with the active region. After forming the second trench, a method of manufacturing a semiconductor device according to an embodiment of the present invention may further include forming a storage node contact on a storage node contact region of the active region.

According to another embodiment of the present invention, a method of manufacturing a semiconductor device includes: forming an element isolation layer which fills an oxide layer into a trench having a given depth to define an active region in a semiconductor substrate; and forming a wall oxide only on a side wall of minor axis direction of the active region, among the active region surface contacting with the element isolation layer.

According to an embodiment of the present invention, a semiconductor device includes an element isolation layer which includes an oxide layer buried in a trench having a given depth, and defines an active region in a semiconductor substrate; and a wall oxide which is formed only on a side wall of minor axis direction of the active region, among the active region surface contacting with the element isolation layer.

The trench may include a first trench formed of line-shape on a semiconductor substrate; and a second trench which separates the active region of line-shape with a uniform gap.

The oxide layer buried in the first trench may include one or more among a Spin On Dielectric (SOD) oxide layer, a High Density Plasma (HDP) oxide layer or a High Aspect Ratio Process (HARP) oxide layer. The oxide layer buried in the second trench may include one or more among a Spin On Dielectric (SOD) oxide layer, a High Density Plasma (HDP) oxide layer or a High Aspect Ratio Process (HARP) oxide layer.

A semiconductor device according to an embodiment of the present invention may further include a liner nitride layer and a liner oxide layer formed on the surface of the trench in which the wall oxide is formed. A semiconductor device according to an embodiment of the present invention may further include a gate intersecting with the active region. A semiconductor device according to an embodiment of the present invention may further include a storage node contact formed on a storage node contact region of the active region.

DESCRIPTION OF EMBODIMENTS

Hereinafter, embodiments of the present invention are described in detail with reference to attached drawings.

Figure 1A:
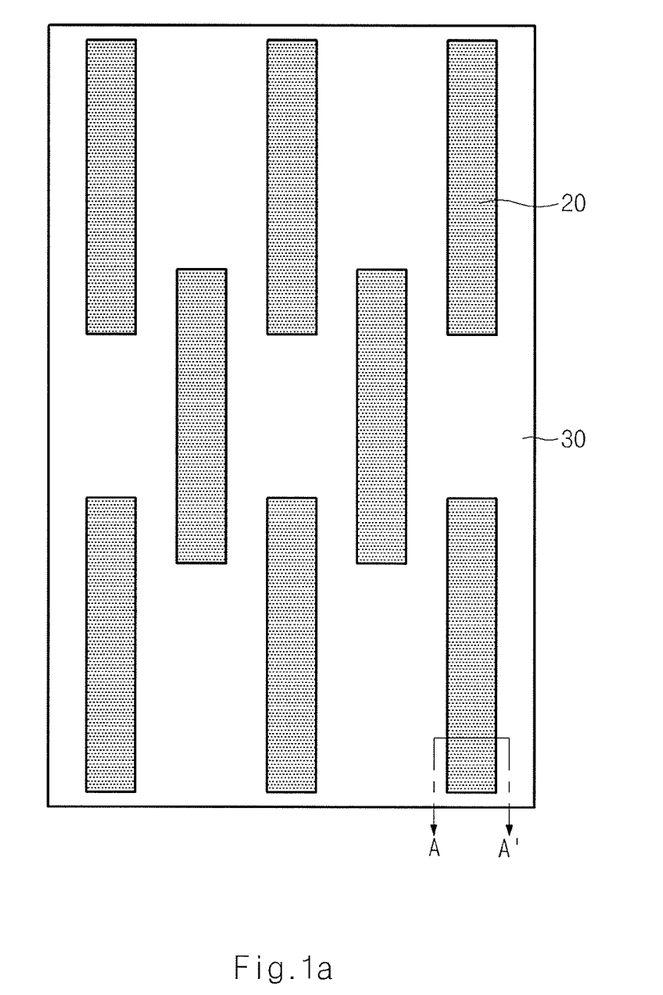
FIGS. 1a and 1b are plane views showing the manufacturing method of a semiconductor device according to an exemplary embodiment of the present invention.
Figure 1B:
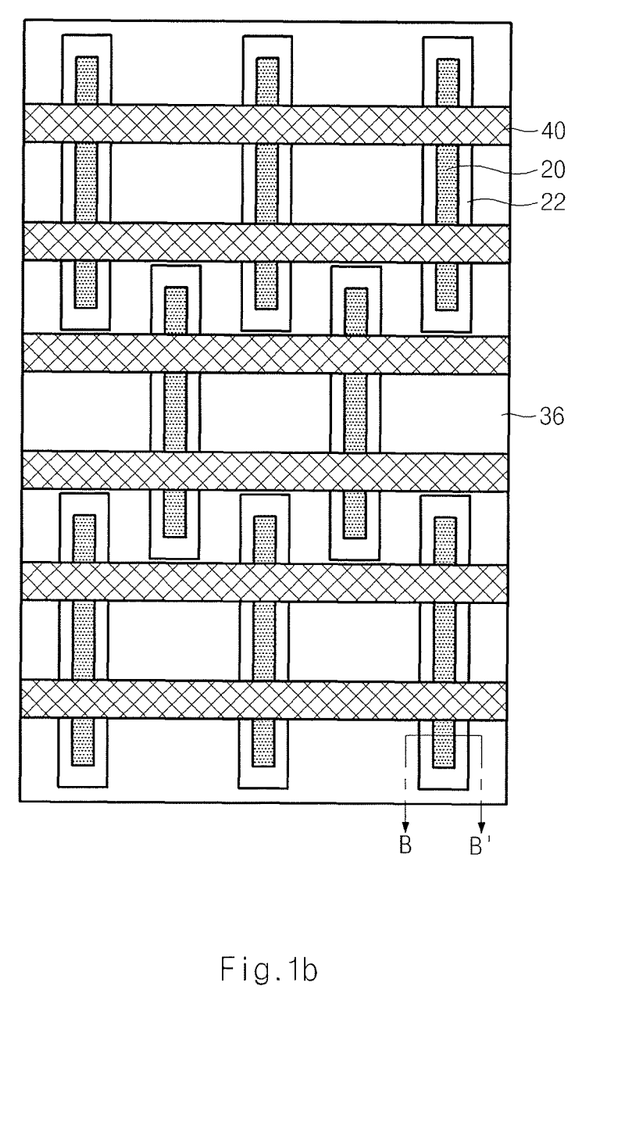

FIGS. 1a and 1b are plane views showing a manufacturing method of a semiconductor device according to an embodiment of the present invention.

Referring to FIG. 1a, the semiconductor device includes an active region 20 in which, for example, a gate, a source and a drain are formed to operate as a cell; and a trench 30 for element isolation in which an element isolation layer 36 (refer to FIG. 1b) is filled with so as to isolate the active regions 20 from each other. The element isolation layer 36 is an insulation layer, e.g., an oxide layer. An example of a method of filling the trench 30 with an element isolation layer 36 is Shallow Trench Isolation (STI). Additionally, before filling the trench 30 with the element isolation layer 36, Wall Oxidation, which is a process of oxidizing the silicon surface of the active region 20, is performed so as to remove plasma damaged regions in the active region 20 and stabilize the transistor operation through, for example, an ion implantation process.

Referring to FIG. 1b, a result of the wall oxidation process is a wall oxide 22 of silicon oxide SiOx formed on the outer surfaces of the active regions 20. As described above, the trench 30 is then filled with the element isolation layer 36, thereby defining active regions 20. In an embodiment of the present invention, the process of filling the trench 30 with the element isolation layer 36 includes: deposited an oxide layer on the semiconductor substrate including the trench 30, and performing Chemical Mechanical Polishing (CMP) on the oxide layer using the semiconductor substrate as an etch stop layer such that the element isolation layer 36 remains only inside the trench 30. The element isolation layer 36 can include, for example, one or more of a Spin On Dielectric (SOD) oxide layer, a High Density Plasma (HDP) oxide layer, and a High Aspect Ratio Process (HARP) oxide layer.

Referring to FIG. 1b, a plurality of gates 40 which intersect each active region 20 may be formed after formation of the active regions 20 and element isolation layer 36. Further, source and drain regions are formed for the respective transistors through an ion implantation process performed on portions of the active region 20 adjacent to a gate 40.

Figure 2A:
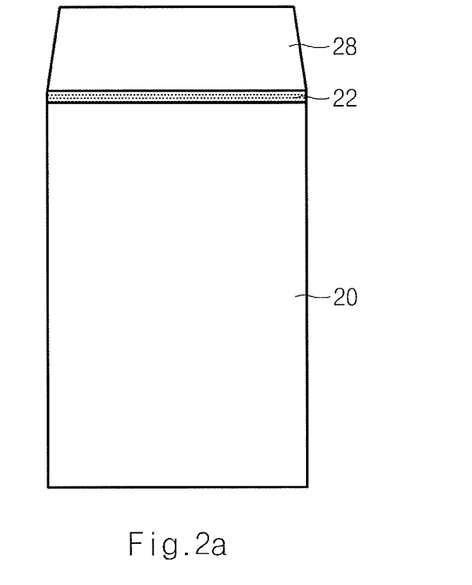
FIGS. 2a and 2b are cross-sectional views taken along line A-A', B-B' of FIGS. 1a and 1b, respectively.
Figure 2B:
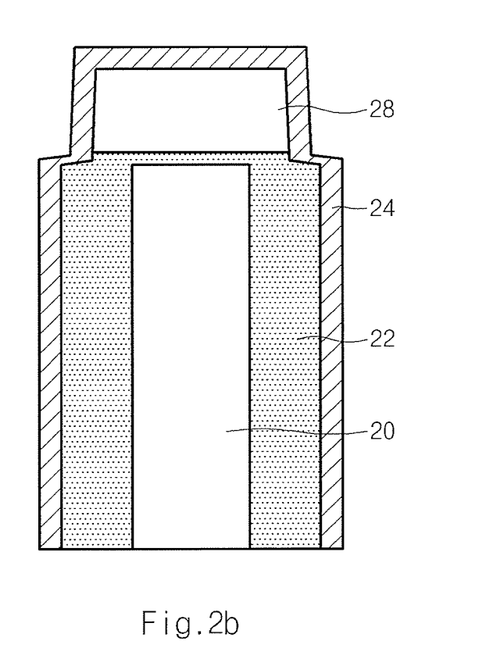

FIGS. 2a and 2b are cross-sectional views taken along lines A-A', B-B' of FIGS. 1a and 1b, respectively. Referring to FIG. 2b, the wall oxide 22 is formed on the side wall of the active region 20. A liner nitride layer 24 can be further laminated on the surface of the wall oxide 22. Additionally, a liner oxide layer (not shown) can be laminated again on the surface of the lamination (i.e., the liner nitride layer 24). Here, an active region mask 28, which acts as the mask for etching the trench 30 for element isolation, is positioned on the upper portion of the active region 20.

In the embodiment, the wall oxide 22 formed in the side wall is relatively thick and reduces the size of the active region in the major axis direction (longitudinal direction of FIG. 1b) so that the practical size of the active region 20 is reduced. Therefore, a problem exists in that it becomes difficult to form a storage node contact and to secure a contact resistance. In a preferred embodiment of the present invention, such a problem can be solved and, hereinafter, a detailed description is provided.

FIGS. 3a to 3d are plane views showing a manufacturing method of a semiconductor device according to an exemplary embodiment of the present invention.

Figure 3A:
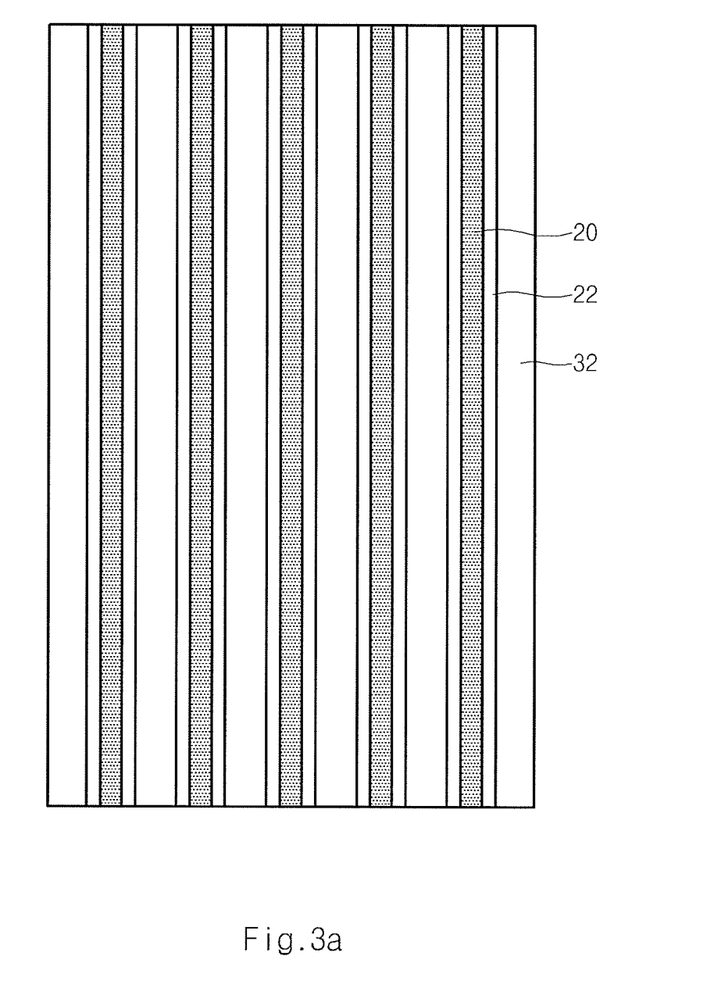
FIGS. 3a to 3d are plane views showing the manufacturing method of a semiconductor device according to an exemplary embodiment of the present invention.

Firstly, as shown in FIG. 3a, first trenches 32 having a line shape (i.e., line and space type first trenches 32) are formed on the semiconductor substrate. As a result, active regions 20 also having a line shape (i.e. line and space type active regions 20) are defined by the first trenches 32. The surface of the active regions 20, which, in an embodiment, are Si material, are oxidized to form the wall oxide 22. In an embodiment, the process of oxidizing the active regions 20 is performed by a method of supplying only oxygen O2 while heating the semiconductor substrate in a furnace. Accordingly, a silicon oxide layer SiOx is formed as a result of the oxidation of the silicon surface of the active region 20. This is advantageous as it prevents hot carrier effects in a transistor of the peripheral region. After the wall oxide 22 is formed, a liner nitride layer 24 (see FIG. 3b) can be laminated on the surface of the wall oxide 22, and a liner oxide layer (not shown) can be further laminated on the surface of the liner nitride layer.

Figure 3B:
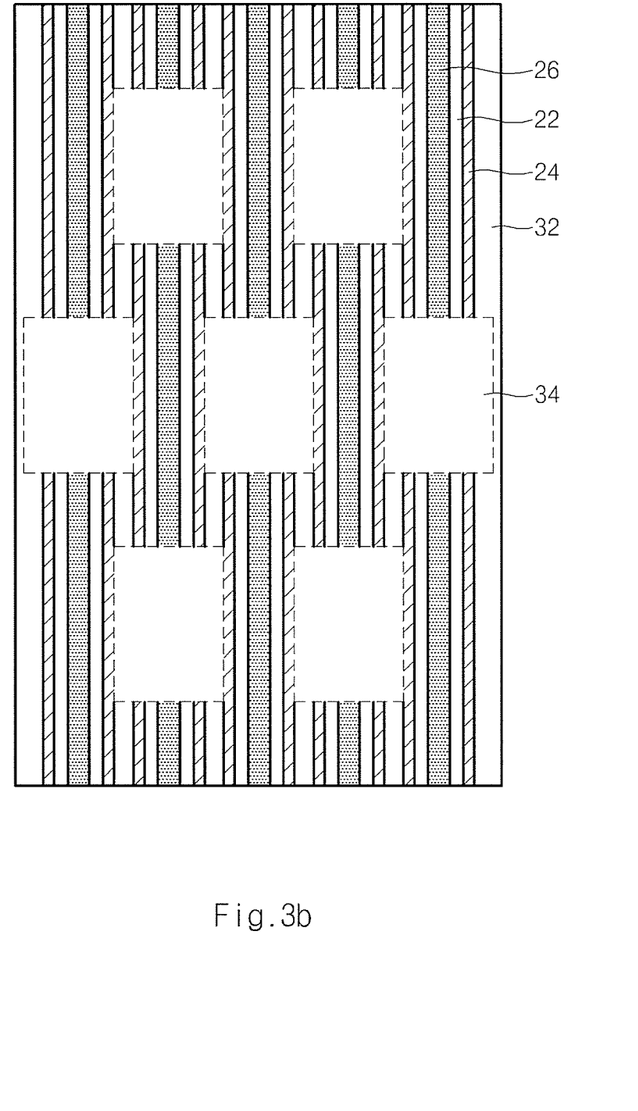

Referring to FIG. 3b, the individual line type active regions 20 are separated, whereby separated active regions 26 are formed from each individual active region 20. In an embodiment, the separated active regions 26 are formed by etching a line type active region 20 at uniform intervals using a mask (not shown) having a contact hole pattern. By using the mask with a contact hole pattern second trenches 34 are formed which separate the active regions 20 into the separated active regions 26.

Figure 3C:
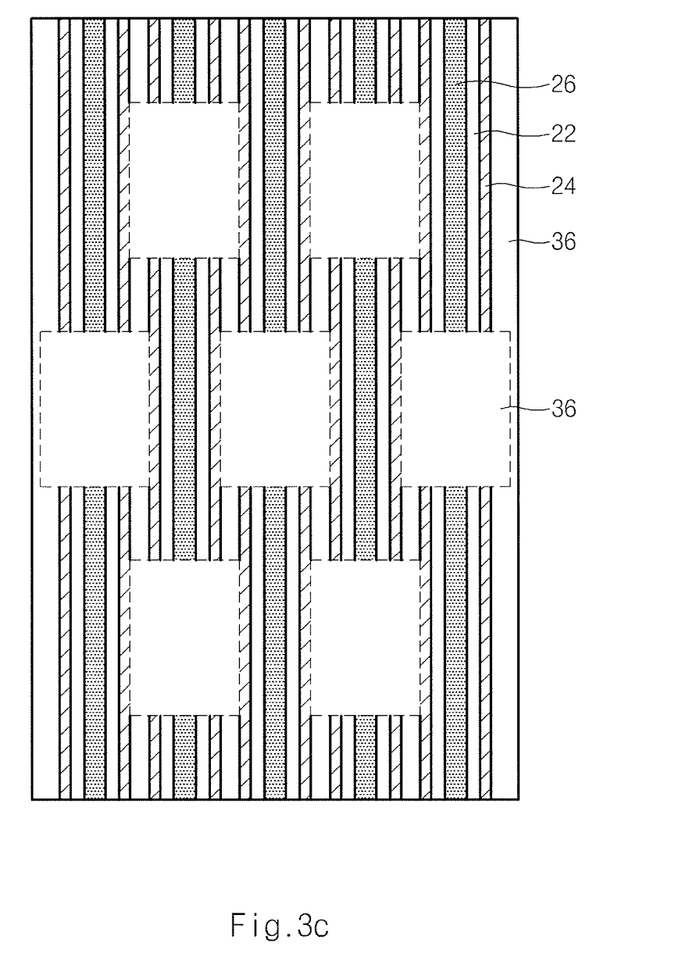
Figure 3D:
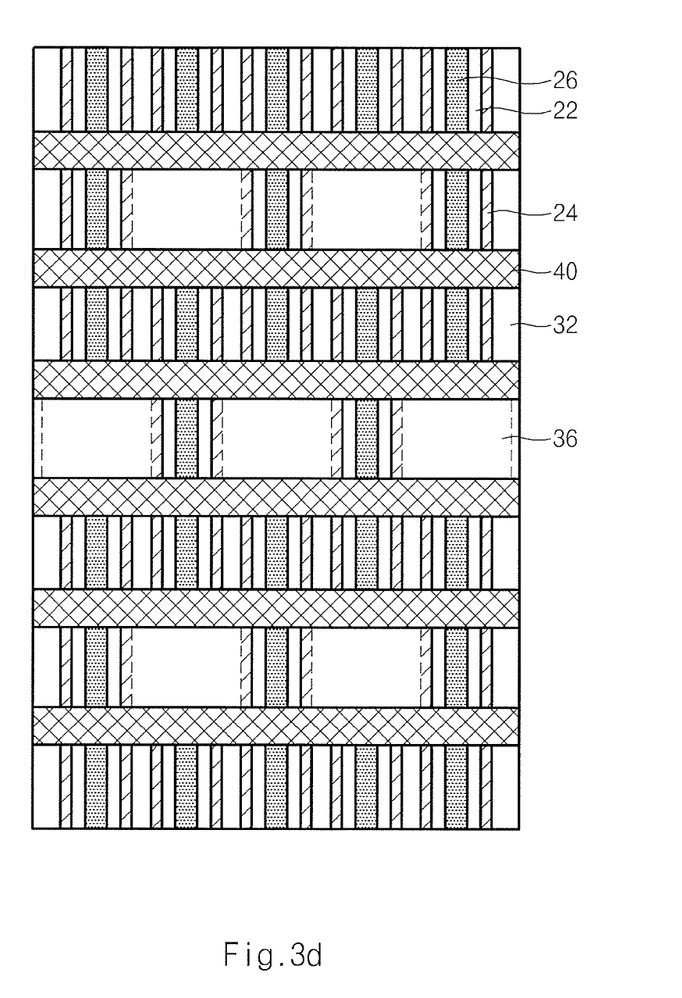

Referring to FIG. 3c, the first line and space type trenches 32 and the second contact hole type trenches 34 are filled with an element isolation layer 36 (e.g., an oxide layer). As a result, the active regions 26 are also isolated from each other and delimited by the element isolation layer 36. Referring to FIG. 3d, a plurality of gates 40 are formed over the semiconductor substrate on which the active regions 36 and the element isolation layer 36 are formed. In an embodiment, an ion implantation process is performed on portions of the active region 20 adjacent to the gates 40 so that source and drain regions are formed, thereby resulting in transistor structures.

In an embodiment, the process of filling the trenches 32 and 34 with the element isolation layer 36 includes: depositing an insulation layer (e.g., an oxide layer) on the semiconductor substrate including the trenches 32 and 34, and performing a Chemical Mechanical Polishing (CMP) on the insulation layer using the semiconductor substrate as an etch stop layer such that the element isolation layer 36 remains only inside of the trenches 32 and 34. The element isolation layer 36 can include, for example, one or more of a Spin On Dielectric (SOD) oxide layer, a High Density Plasma (HDP) oxide layer, and a High Aspect Ratio Process (HARP) oxide layer.

Accordingly, in an exemplary embodiment of the present invention, line and space type active regions 20 (refer to FIG. 3a) are formed and a wall oxide 22 is formed on surfaces of the active regions 20. Thereafter, the active regions 20 (refer to FIG. 3b) are separated to form separated active regions 26. As a result, the wall oxide 22 is formed only in the side walls of the minor axis direction (horizontal direction of FIG. 3b) of the active regions 26, whereas the wall oxide 22 is not formed in side walls of the major axis direction (vertical direction of FIG. 3b; longitudinal direction of active region) of the active region 26. That is, the wall oxide is formed only in the side walls that extend in the longitudinal direction of the active region. Therefore, an effect is obtained in which the longitudinal length of the active region 20 is not reduced (i.e., the end of an upper portion and a lower portion are not oxidized as shown in FIGS. 3b to 3d).

Figure 4:
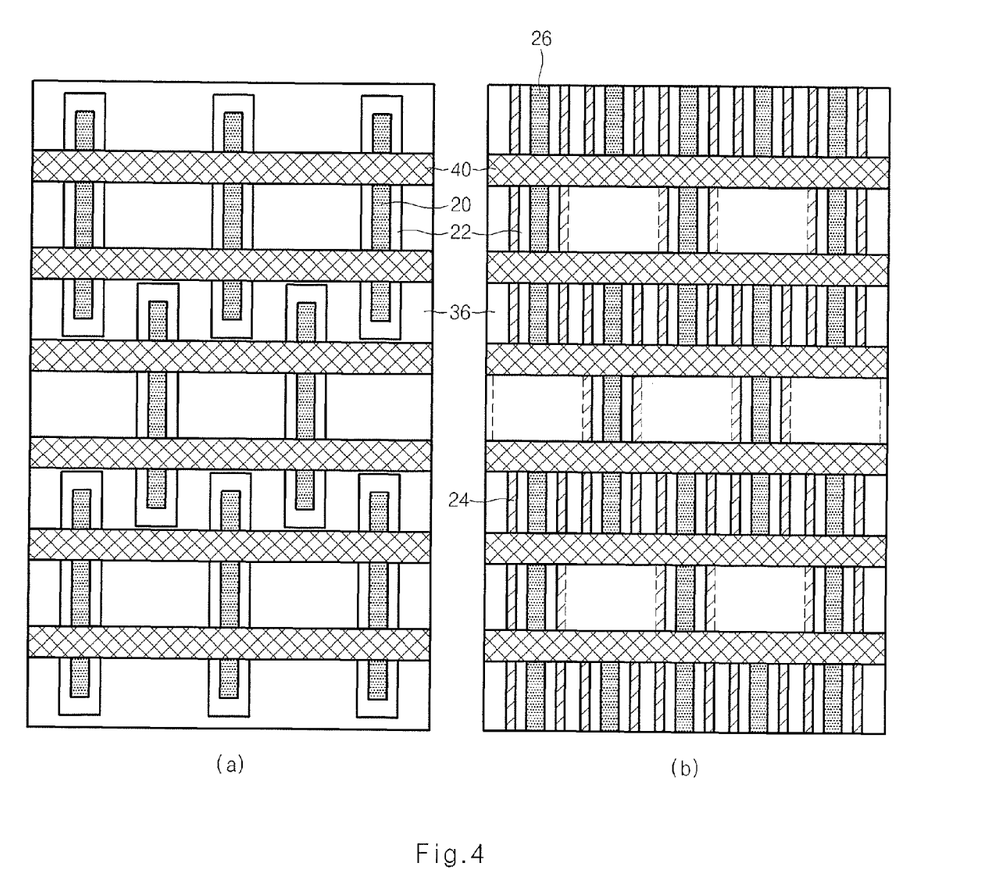
FIG. 4 is a plane view comparing embodiments of the present invention.

FIG. 4 is a plane view comparing embodiments of the present invention.

Comparing (a) and (b) of FIG. 4, the wall oxide 22 is formed in the side wall of the major axis direction (longitudinal direction) of the active region 20 in (a), and therefore the practical size of the active region 20 is reduced. However, in the embodiment shown in (b) of FIG. 4, the wall oxide 22 is not formed in the side wall of the major axis direction (longitudinal direction) of the active region 20, and therefore there is no loss in the size of the active region 20 in the longitudinal direction.

FIGS. 5a to 5f are cross-sectional views showing the steps of forming trenches 30, 32 according to an exemplary embodiment of the present invention.

In the exemplary embodiment of the present invention, single patterning technology can be used for the process of forming trenches 30 and 32 for element isolation. However, it is more preferable to use the spacer patterning technology, which can form a pattern having a smaller critical dimension (e.g., line width) by using a spacer. Firstly, referring to FIG. 5a, a first amorphous carbon layer 51, a first oxynitride layer 52, a polysilicon layer 53, a second amorphous carbon layer 55, and a second oxynitride layer 57 are sequentially deposited on the semiconductor substrate 10. The amorphous carbon layers 51 and 55 and oxynitride layers 52 and 57 function as a hard mask.

Figure 5A:
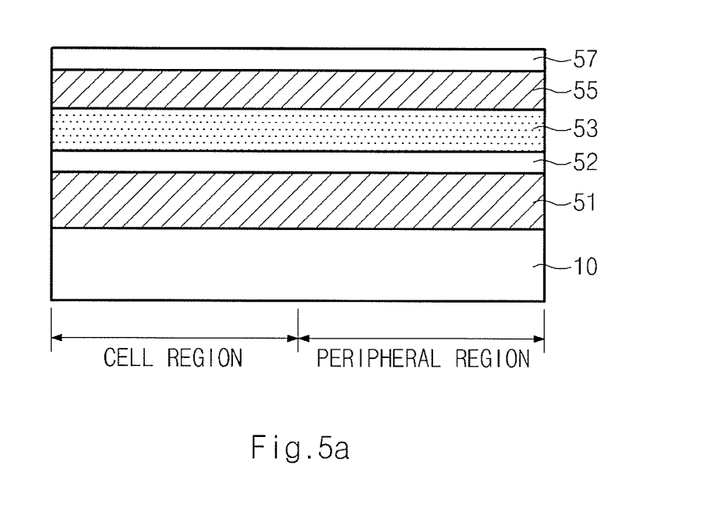
FIGS. 5a to 5f are cross-sectional views showing the manufacturing method of a semiconductor device according to an exemplary embodiment of the present invention.
Figure 5B:
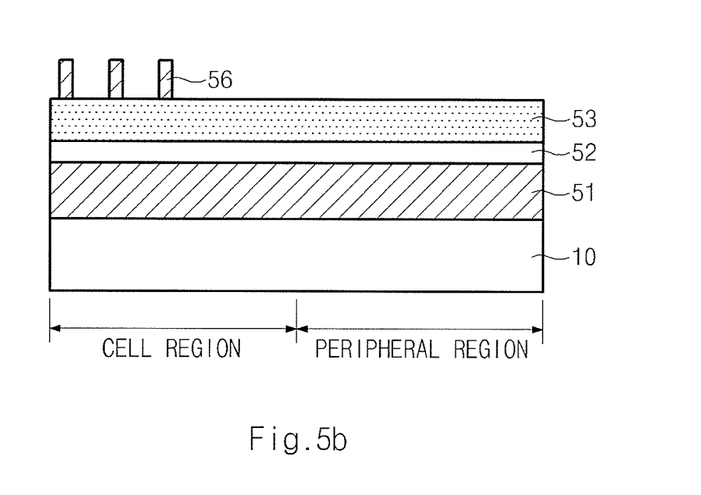

Then, the photosensitive pattern (not shown) is formed on the upper surface of the second oxynitride layer 57, and the second oxynitride layer 57, the second amorphous carbon layer 55, and the polysilicon layer 53 are etched using the photosensitive pattern (not shown) as a mask, so that, as shown in FIG. 5b, partitions 56 of amorphous carbon are formed.

Figure 5C:
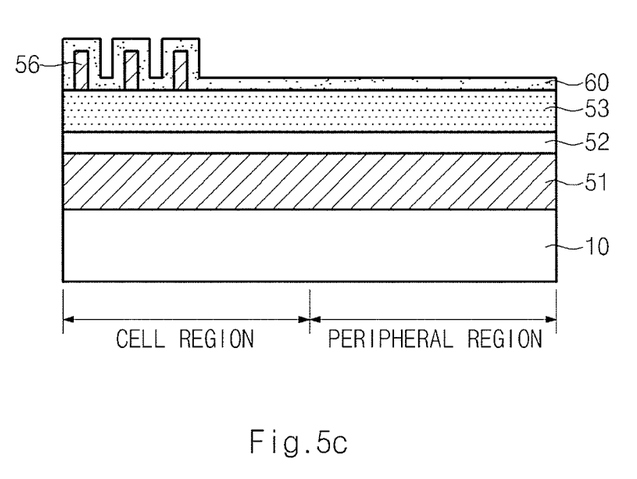
Figure 5D:
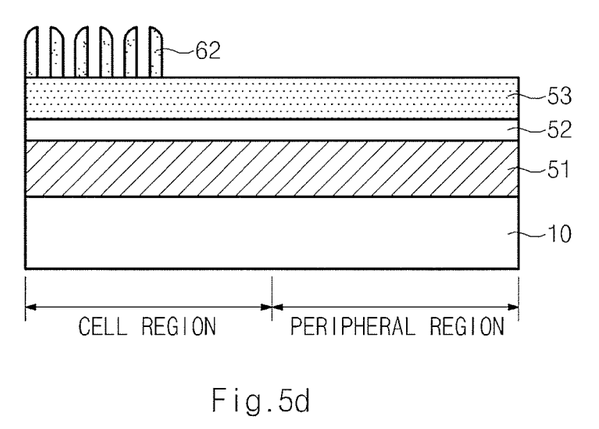

Thereafter, referring to FIG. 5c, an oxide layer 60 for spacers is deposited over the partitions 56 and the polysilicon layer 53. As shown in FIG. 5d, portions of the oxide layer 60 for spacers is etched and removed such that spacers 62 of an oxide remain only in side walls of the partitions 56. The partitions 56 of amorphous carbon are also removed by etching so that only the spacers 62 remain on the upper surface of the polysilicon layer 53. At this time, the critical dimension between the spacers 62 is approximately half of the critical dimension of the initial partitions 56.

Figure 5E:
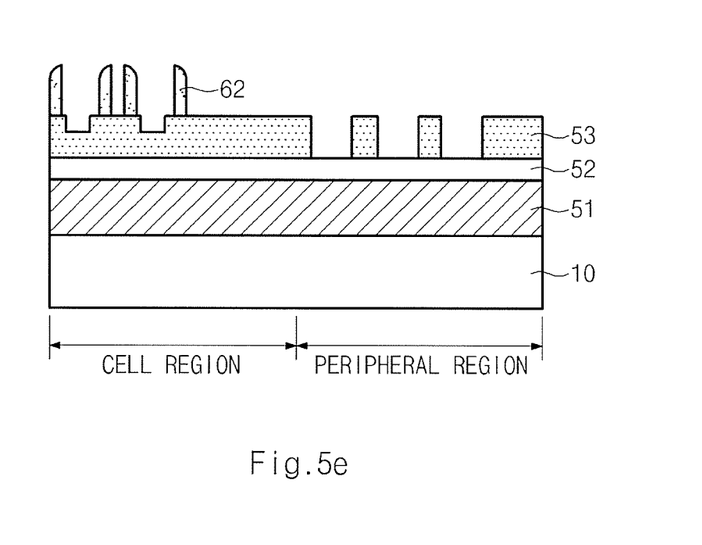

As shown in FIG. 5e, the polysilicon layer 53 is etched using the spacers 62 as a mask and is patterned. In an embodiment, the pattern of the peripheral region is simultaneously formed using a separate mask (not shown) also in the peripheral region.

Figure 5F:
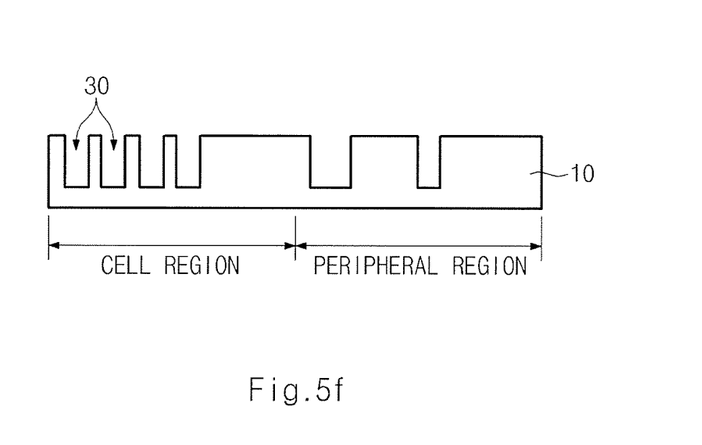

Thereafter, referring to FIG. 5f, the first oxynitride layer 52, the first amorphous carbon layer 51, and the semiconductor substrate 10 are etched using the etched poly silicon layer pattern as a mask, so that the trenches 30 for element isolation are formed in the cell region of the semiconductor substrate 10, and the peripheral circuit pattern is formed in the peripheral region.

Accordingly, a trench 30 for element isolation having small critical dimension is formed on the semiconductor substrate 10 in the cell region, and the active regions 26 are formed as described above. Therefore, the embodiment of the present invention provides an effect in which the size of the active region can be easily secured in the semiconductor substrate, the resistance of the storage node contact can be reduced, and the critical dimension of the semiconductor device can be efficiently reduced.

The above embodiments of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:
1. A method of manufacturing a semiconductor device, the method comprising:
forming first trenches having a line-shape on a semiconductor substrate so as to define an active region having a line shape, the first trenches being formed continuously along an entire length of a semiconductor substrate;
forming a wall oxide on surfaces of the first trenches;

forming a second trench which separates the active region into a plurality of separated active regions; and filling the first trenches having surfaces on which the wall oxide is formed and the second trench with an element isolation layer.

2. The method of claim 1, further comprising forming a liner nitride layer and a liner oxide layer on the surfaces of the first trenches on which the wall oxide is formed, after forming the wall oxide.

3. The method of claim 1, wherein filling the first trenches on which the wall oxide is formed and the second trench with an element isolation layer comprises:

forming an insulation layer on the semiconductor substrate so as to fill the first trenches and the second trench; and performing a chemical mechanical polishing (CMPing) on the insulation layer using the semiconductor substrate as an etch stop layer so as to form the element isolation layer.

4. The method of claim 3, wherein the insulation layer includes one or more of a Spin On Dielectric (SOD) oxide layer, a High Density Plasma (HDP) oxide layer and a High Aspect Ratio Process (HARP) oxide layer.

5. The method of claim 1, wherein the element isolation layer includes an oxide layer.

6. The method of claim 1, wherein forming first trenches comprises:

forming a hard mask layer on the semiconductor substrate;

forming spacers on an upper surface of the hard mask layer; and etching the hard mask and the semiconductor substrate using the spacers as a mask.

7. The method of claim 6, wherein forming a hard mask layer comprises forming a first amorphous carbon layer, a first oxynitride layer, a polysilicon layer, a second amorphous carbon layer, and a second oxynitride layer on the semiconductor substrate.

8. The method of claim 6, wherein forming spacers comprises:

forming partitions on an upper surface of the hard mask layer;

depositing an oxide layer over the partitions and the hard mask layer;

removing portions of the oxide layer so as to form the spacers on the sides of the partition; and removing the partitions.

9. The method of claim 6, wherein the first trenches are formed in a cell region of the semiconductor substrate, and the method further comprises:

forming a pattern on the semiconductor substrate in a peripheral region after forming the spacers.

10. The method of claim 1, wherein forming first trenches comprises:

forming a first amorphous carbon layer, a first oxynitride layer, a polysilicon layer, a second amorphous carbon layer, and a second oxynitride layer sequentially on the semiconductor substrate;

forming a photoresist pattern on an upper surface of the second oxynitride layer;

etching the second oxynitride layer and the second amorphous carbon layer using the photoresist pattern as a mask so as to form partitions;

depositing an oxide layer over the partitions and the polysilicon layer;

performing an etch back process on the oxide layer so as to form spacers on sides of the partitions;

removing the partitions; and etching the first silicon oxynitride layer, the first amorphous carbon layer, and the semiconductor substrate using the spacers as a mask so as to form the first trenches.

11. The method of claim 1, further comprising: forming a gate intersecting the active region after forming the second trench.

12. The method of claim 1, further comprising:

forming a storage node contact on a storage node contact region of the active region after forming the second trench.

13. A semiconductor device, comprising:

a semiconductor substrate having one or more trenches defining an active region having sidewalls, at least one of the trenches being formed continuously along an entire length of the semiconductor substrate in the longitudinal direction; and an element isolation layer formed in the trenches so as to isolate the active region, and wherein the one or more trenches define a plurality of the active regions, and the one or more trenches comprise:

first trenches formed on a semiconductor substrate so as to form a line shape active region, the first trenches being formed continuously along an entire length of the substrate; and a second trench which separates the line shape active region into the plurality of the active regions having the sidewalls.

14. The semiconductor device of claim 13, wherein the element isolation layer includes one or more of a Spin On Dielectric (SOD) oxide layer, a High Density Plasma (HDP) oxide layer or a High Aspect Ratio Process (HARP) oxide layer.

15. The semiconductor device of claim 13, wherein the element isolation layer comprises an oxide layer buried in the first trenches or the second trench or both the first and second trenches, and the oxide layer includes one or more of a Spin On Dielectric (SOD) oxide layer, a High Density Plasma (HDP) oxide layer or a High Aspect Ratio Process (HARP) oxide layer.

16. The semiconductor device of claim 13, further comprising a liner nitride layer and a liner oxide layer formed on the surface of the trench in which the wall oxide is formed.

17. The semiconductor device of claim 13, further comprising a gate intersecting the active region.

18. The semiconductor device of claim 13, further comprising a storage node contact formed on a storage node contact region of the active region.

* * * * *